United States Patent
Liu et al.

(10) Patent No.: US 9,514,990 B2
(45) Date of Patent: Dec. 6, 2016

(54) METHODS FOR MANUFACTURING SEMICONDUCTOR DEVICES HAVING DIFFERENT THRESHOLD VOLTAGES

(71) Applicant: Samsung Electronics Co., Ltd., Suwon-si, Gyeonggi-do (KR)

(72) Inventors: Bin Liu, Suwon-si (KR); Sungmin Kim, Bupyeong-gu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/822,077

(22) Filed: Aug. 10, 2015

(65) Prior Publication Data
US 2016/0049335 A1    Feb. 18, 2016

(30) Foreign Application Priority Data
Aug. 12, 2014    (KR) .......... 10-2014-0104581

(51) Int. Cl.
*H01L 21/8234* (2006.01)
*H01L 21/8238* (2006.01)

(52) U.S. Cl.
CPC ........... *H01L 21/823431* (2013.01); *H01L 21/823412* (2013.01); *H01L 21/823814* (2013.01); *H01L 21/823821* (2013.01)

(58) Field of Classification Search
CPC ........... H01L 29/66795; H01L 29/785; H01L 21/823431; H01L 27/0886; H01L 21/02532; H01L 21/823821; H01L 27/0924; H01L 21/76224; H01L 21/845; H01L 27/1211; H01L 29/66818; H01L 29/7856; H01L 2029/7858; H01L 29/7858
See application file for complete search history.

(56) References Cited

U.S. PATENT DOCUMENTS

| 6,413,802 B1 | 7/2002 | Hu et al. |
| 6,815,738 B2 | 11/2004 | Rim |
| 7,115,947 B2 | 10/2006 | Clark, Jr. et al. |

(Continued)

FOREIGN PATENT DOCUMENTS

| KR | 100634179 B1 | 10/2006 |
| KR | 20070027961 A | 3/2007 |

(Continued)

OTHER PUBLICATIONS

C.-H. Jan et al. "A 22nm SoC Platform Technology Featuring 3-D Tri-Gate and High-k/Metal Gate, Optimized for Ultra Low Power, High Performance and High Density SoC Applications". Logic Technology Development—IEDM12-44, 2012, pp. 3.1.1-3.1.4.

(Continued)

*Primary Examiner* — Mohsen Ahmadi
(74) *Attorney, Agent, or Firm* — Harness, Dickey & Pierce, P.L.C.

(57) ABSTRACT

Methods for manufacturing a semiconductor device including a field effect transistor include forming first fins protruding from a substrate including a first region and a second region, the first fins including silicon-germanium (SiGe), forming a first mask pattern to expose the first fins disposed in the second region, the first mask pattern covering the first fins disposed in the first region, oxidizing the first fins in the second region to form second fins in the second region, and forming germanium (Ge)-rich layers each disposed on a surface of a respective one of the second fins.

19 Claims, 9 Drawing Sheets

(56) References Cited

U.S. PATENT DOCUMENTS

| | | | |
|---|---|---|---|
| 7,172,943 | B2 | 2/2007 | Yeo et al. |
| 7,217,608 | B1 | 5/2007 | Xiang |
| 7,598,145 | B2 | 10/2009 | Damlencourt et al. |
| 7,855,105 | B1 | 12/2010 | Jagannathan et al. |
| 7,902,014 | B2 | 3/2011 | Doyle et al. |
| 7,972,971 | B2 | 7/2011 | Damlencourt et al. |
| 8,053,301 | B2 | 11/2011 | Jaeger et al. |
| 8,211,772 | B2 | 7/2012 | Kavalieros et al. |
| 8,299,453 | B2 | 10/2012 | Zhu |
| 8,395,195 | B2 | 3/2013 | Chang et al. |
| 8,574,981 | B2 | 11/2013 | Flachowsky et al. |
| 8,623,728 | B2 * | 1/2014 | Chang ............... H01L 29/165 438/285 |
| 8,828,818 | B1 * | 9/2014 | Rodder ............ H01L 29/66795 257/E21.182 |
| 8,907,431 | B2 | 12/2014 | Kuo et al. |
| 2009/0065853 | A1 * | 3/2009 | Hanafi ............... H01L 29/1054 257/327 |
| 2010/0144121 | A1 * | 6/2010 | Chang ............... H01L 29/7851 438/478 |
| 2011/0108920 | A1 * | 5/2011 | Basker ............... H01L 21/845 257/351 |
| 2011/0180847 | A1 * | 7/2011 | Ikeda ............... H01L 29/045 257/190 |
| 2012/0228716 | A1 | 9/2012 | Harley et al. |
| 2013/0270641 | A1 | 10/2013 | Chi |
| 2013/0285117 | A1 | 10/2013 | Majumdar et al. |
| 2014/0252483 | A1 * | 9/2014 | Nagumo ............ H01L 27/1211 257/351 |
| 2014/0312423 | A1 * | 10/2014 | Cheng ............ H01L 21/823807 257/351 |
| 2014/0353760 | A1 * | 12/2014 | Loubet ............ H01L 21/823821 257/369 |
| 2016/0204131 | A1 * | 7/2016 | Cheng ............... H01L 27/1211 257/351 |

FOREIGN PATENT DOCUMENTS

| | | |
|---|---|---|
| KR | 100944356 B1 | 3/2010 |
| KR | 100945799 B1 | 3/2010 |
| KR | 101312747 B1 | 9/2013 |

OTHER PUBLICATIONS

Ok, K. Akarvardar. "Strained SiGe and Si FinFETs for High Performance Logic with SiGe/Si stack on SOI." IEDM10-776, 2010, pp. 34.2.1-34.2.4.

Mitard, Witters, "1mA/um-ION strained SiGe45%-IFQW pFETs with raised and embedded S/D", 2011 Symposium on VLSI Circuits: Digest of Technical Papers—IEEE, 2011, pp. 1-2.

K. Cheng et al., "High Performance Extremely Thin SOI (ETSOI) Hybrid CMOS with SI Channel NFET and Strained SiGe Channel PFET", IBM—IEDM12-419, 2012, pp. 18.1.1-18.1.4.

L. Witters, "Dual-Channel Technology with Cap-free Single Metal Gate for High Performance CMOS in Gate-First and Gate-Last Integration", IEDM11-654, 2011. pp. 28.6.1-28.6.4.

M. Togo et al., "Phosphorus Doped SiC Source Drain and SiGe Channel for Scaled Bulk FinFETs", IEEE—IEDM12-423, 2012, pp. 18.2.1-18.2.4.

H.N. Alshareef et al. "Work function engineering using lanthanum oxide interfacial layers", Applied Physics Letters 89, 2006, pp. 232103-1-232103-4.

Ching-Huang Lu et al. "Characteristics and Mechanism of Tunable Work Function Gate Electrodes Using a Bilayer Metal Structure on $SiO_2$ and $HfO_2$." IEEE Electron Device Letters, vol. 26, No. 7, Jul. 2005, pp. 445-447.

C.-H. Lin et al. "Channel Doping Impact on FinFETs for 22nm and Beyond". 2012 Symposium on VLSI Technology Digest of Technical Papers. pp. 15-16.

Ethan Long et al. "Ge concentrations in pile-up layers of sub-100-nm SiGe films for nano-structuring by thermal oxidation". AVS: Science of Technology of Materials, Interfaces, and Processing. 2012. pp. 1-7.

A. Terrasi et al. "Rapid thermal oxidation of epitaxial SiGe thin films". Materials Science and Engineering B89. 2002. Elsevier Science B.V. pp. 269-273.

\* cited by examiner

METHODS FOR MANUFACTURING SEMICONDUCTOR DEVICES HAVING DIFFERENT THRESHOLD VOLTAGES

CROSS-REFERENCE TO RELATED APPLICATION

This U.S. non-provisional patent application claims the benefit of priority under 35 U.S.C. §119 to Korean Patent Application No. 10-2014-0104581, filed on Aug. 12, 2014, in the Korean Intellectual Property Office, the disclosure of which is hereby incorporated by reference in its entirety.

BACKGROUND

Field

The inventive concepts relate to semiconductor devices and/or methods for manufacturing the same. More particularly, the inventive concepts relate to semiconductor devices including a field effect transistor and/or methods for manufacturing the same.

Description of Related Art

Semiconductor devices are widely used in the electronic industry because of their small size, multi-function, and/or lower manufacturing costs. Semiconductor devices may be classified into semiconductor memory devices storing logical data, semiconductor logic devices processing logical data, and hybrid semiconductor devices having both the function of the semiconductor memory devices and the function of the semiconductor logic devices. Semiconductor devices with improved characteristics have been demanded with the development of the electronic industry. For example, high-reliable, high-speed, and/or multi-functional semiconductor devices have been increasingly demanded. To satisfy these demands, structures of semiconductor devices become more complicated and integration degrees of semiconductor devices are increasing.

SUMMARY

Example embodiments of the inventive concepts may provide semiconductor devices including field effect transistors having threshold voltages different from each other.

Example embodiments of the inventive concepts may also provide methods for manufacturing a semiconductor device including field effect transistors having threshold voltages different from each other.

In some example embodiments, a method for manufacturing a semiconductor device includes forming first fins protruding from a substrate, the substrate including a first region and a second region, and the first fins including silicon-germanium (SiGe); forming a first mask pattern to expose the first fins disposed in the second region, the first mask pattern covering the first fins disposed in the first region; oxidizing the first fins in the second region to form second fins in the second region; and forming germanium (Ge)-rich layers, each of the Ge-rich layers disposed on a surface of a respective one of the second fins.

In some example embodiments, a Ge concentration of the second fins may be substantially equal to a Ge concentration of the first fins.

In some example embodiments, the oxidizing selectively oxidizes the first fins in the second region using the first mask pattern as an oxidation prevention layer.

In some example embodiments, the oxidizing reduces widths of the first fins in the second region.

In some embodiments, the method may further include forming a device isolation layer covering sidewalls of the first fins in the first and second regions. In this case, the first fins may include protruding portions protruding from the device isolation layer and including SiGe.

In some example embodiments, the substrate may include silicon (Si). The forming the first fins may include forming buried portions on the substrate; and forming protruding portions including SiGe on the buried portions. In this case, the buried portions may include buffer layers that reduce a difference between a lattice constant of the substrate and a lattice constant of the protruding portions.

In some example embodiments, the forming the first fins may include forming an epitaxial layer including SiGe on the substrate; forming second mask patterns on the epitaxial layer; and etching the epitaxial layer using the second mask patterns as etch masks.

In some example embodiments, the forming the first fins may include forming a device isolation layer on the substrate, forming trenches in the device isolation layer, the trenches exposing a top surface of the substrate, and growing epitaxial layers from the top surface of the substrate exposed by the trenches, the epitaxial layers filling the trenches and including SiGe.

In some example embodiments, the oxidizing oxidizes surfaces of the first fins in the second region to form the second fins and oxide layers covering the second fins. The Ge-rich layers may be formed along with the oxide layers at the same time and between the second fins and the oxide layers.

In some example embodiments, the method may further include removing the oxide layers disposed on the second fins and the first mask pattern disposed in the first region; and forming a gate dielectric pattern and a gate electrode pattern that cover the second fins of the second region and the first fins of the first regions.

In some example embodiments, the method may further include forming source/drain regions on the first fins at both sides of the gate electrode pattern; and forming source/drain regions on the second fins at both sides of the gate electrode pattern.

In other example embodiments, a method for manufacturing a semiconductor device includes forming a first fin protruding from a first region of a substrate and including silicon-germanium (SiGe); and forming a second fin protruding from a second region of the substrate and including SiGe, the second fin including a germanium (Ge)-rich layer disposed on a surface of the second fin. A Ge concentration of the Ge-rich layer may be greater than Ge concentrations of the first and second fins.

In some example embodiments, the forming the second fin includes forming an oxide layer covering the Ge-rich layer by an oxidizing process. A width of an upper portion of a structure including the oxide layer and the second fin may be greater than a width of an upper portion of the first fin.

In some example embodiments, a Ge concentration of the second fin may be substantially equal to that of the first fin.

In some example embodiments, the method may further include forming a device isolation layer covering sidewalls of the first and second fins. In this case, the formation of the first fin may include forming a first buried portion surrounded by the device isolation layer; and forming a first protruding portion protruding from the first buried portion. The formation of the second fin may include forming a second buried portion surrounded by the device isolation layer; and a second protruding portion protruding from the second buried portion. The Ge-rich layer may cover the second protruding portion.

In some example embodiments, the substrate may include silicon (Si). The first and second buried portions may include buffer layers that reduce a difference between a lattice constant of the substrate and a lattice constant of the first and second protruding portions.

In some example embodiments, the method may further include a gate dielectric pattern and a gate electrode pattern that cover the first and second fins. In this case, the Ge-rich layer may be in contact with the second fin and the gate dielectric pattern.

In some example embodiments, the method may further include first source/drain regions disposed on the first fin at both sides of the gate electrode pattern; and second source/drain regions disposed on the second fin at both sides of the gate electrode pattern.

In further example embodiments, a method of manufacturing a semiconductor device, includes forming a first fin and a second fin extending over a first region and a second region of a substrate, respectively, the first and the second fins including silicon germanium (SiGe), forming a mask pattern over the first fin to expose the second fin, and oxidizing the second fin so as to form a third fin including a SiGe layer and a germanium (Ge)-rich layer covering surfaces of the SiGe layer.

In some example embodiments, the third fin may further include an oxide layer covering surfaces of the SiGe layer, the oxide layer being formed during the oxidizing.

The method may further include forming a device isolation pattern having trenches therein over the first and the second regions of the substrate. The forming the first fin and the second fin may include forming a buried portion of the first fin and a buried portion of the second fin filling the trench over a respective one of the first and second regions, and forming a protruding portion of the first fin and a protruding portion of the second fin such that the protruding portions protrude from a respective one of the buried portions. The buried portions of the first and second fins may include a semiconductor element having a lattice constant different than a lattice constant of SiGe. The protruding portions of the first and second fins may include SiGe.

The forming the first fin and the second fin may include growing a semiconductor layer over the substrate, forming a mask pattern over the semiconductor layer, and etching the semiconductor layer using the mask pattern as an etching mask to form the first and second fins. A Ge concentration of the first fin may be substantially equal to a Ge concentration of the SiGe layer.

The oxidizing may include removing Si from the SiGe in the second fin to form the Ge-rich layer so that a Ge concentration of the Ge-rich layer is substantially higher than that of the SiGe layer of the third fin.

In some example embodiments, a threshold voltage of a first transistor using the first fin as a channel region may be different from a threshold voltage of a second transistor using the second fin as a channel region.

In some example embodiments, the first fin and the second fin may be doped with dopants of the same conductivity type or different conductivity types from each other.

BRIEF DESCRIPTION OF THE DRAWINGS

Example embodiments will be more clearly understood from the following detailed description taken in conjunction with the accompanying drawings. FIGS. 1A-9 represent non-limiting, example embodiments as described herein.

FIGS. 1A to 6A are perspective views illustrating a method for manufacturing a semiconductor device according to some example embodiments of the inventive concepts;

FIGS. 1B to 6B are cross-sectional views taken along lines A-A' of FIGS. 1A to 6A, respectively;

DETAILED DESCRIPTION OF THE EXAMPLE EMBODIMENTS

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. The two different directions may or may not be orthogonal to each other. The three different directions may include a third direction that may be orthogonal to the two different directions. The plurality of device structures may be integrated in a same electronic device. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure. The plurality of device structures may be arranged in an array and/or in a two-dimensional pattern.

In order to more specifically describe example embodiments, various features will be described in detail with reference to the attached drawings. However, example embodiments described are not limited thereto.

A method for manufacturing a semiconductor device according to some example embodiments will be described with reference to FIGS. 1A to 6A and 1B to 6B. FIGS. 1A to 6A are perspective views illustrating a method for manufacturing a semiconductor device according to some example embodiments of the inventive concepts. FIGS. 1B to 6B are cross-sectional views taken along lines A-A' of FIGS. 1A to 6A, respectively.

Figure 1A:
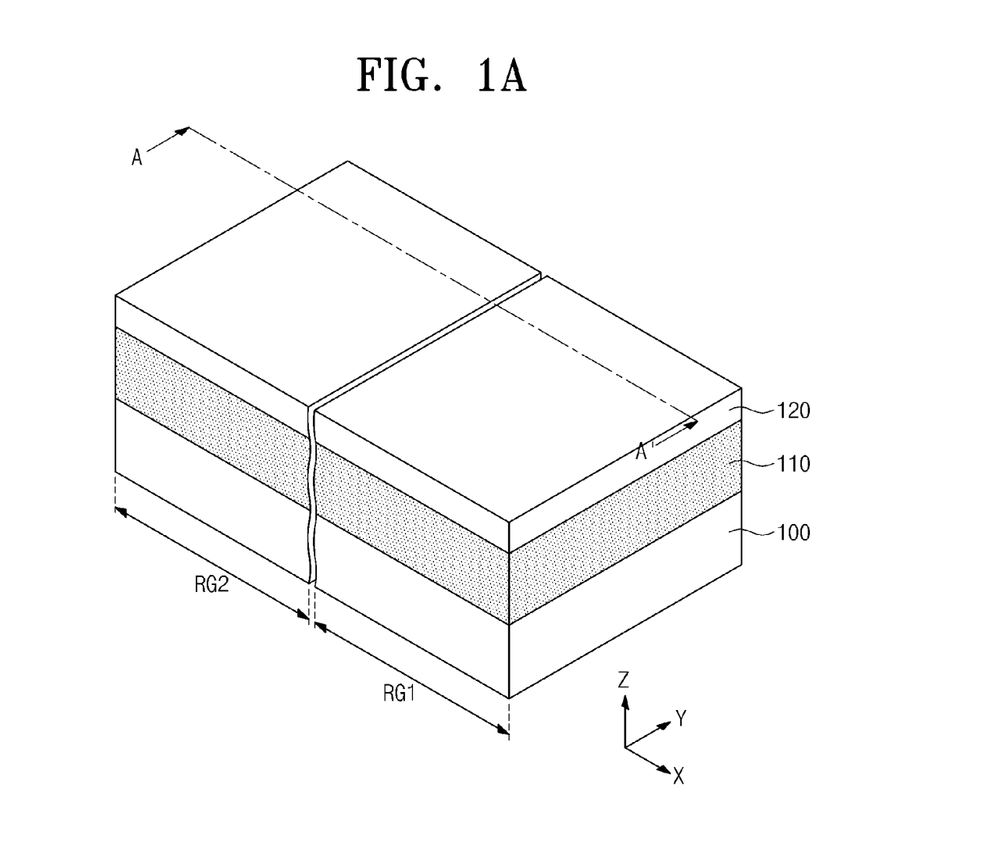
Figure 1B:
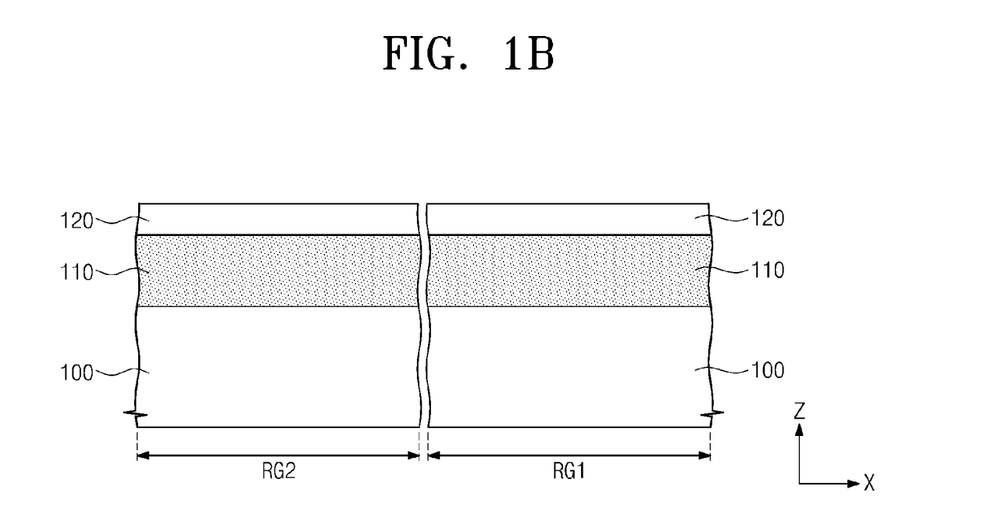

Referring to FIGS. 1A and 1B, a substrate 100 including a first region RG1 and a second region RG2 may be provided. The substrate 100 may include a semiconductor-based structure. In some example embodiments, the substrate 100 may be a silicon substrate or a silicon-on-insulator (SOI) substrate. The first region RG1 and the second region RG2 may correspond to different regions of the substrate 100. For example, the first and second regions RG1 and RG2 may be regions in which different threshold voltages from each other are required. In some embodiments, all of the first and second regions RG1 and RG2 may be N-type metal-oxide-semiconductor (NMOS) transistor regions, or P-type MOS (PMOS) transistor regions. In other example embodiments, one of the first and second regions RG1 and RG2 may be the NMOS transistor region, and the other of the first and second regions RG1 and RG2 may be the PMOS transistor region. However, example embodiments of the inventive concepts are not limited thereto.

A buffer layer 110 and a semiconductor layer 120 may be sequentially formed on the substrate 100. The buffer layer 110 may be formed by a selective epitaxial growth (SEG) process using the substrate 100 as a seed layer. The buffer layer 110 may relax (or, alternatively, reduce) a difference between a lattice constant of the substrate 100 and a lattice constant of the semiconductor layer 120. In other words, the buffer layer 110 may relax (or, alternatively, reduce) a stress that may be caused by the difference between the lattice constants of the substrate 100 and the semiconductor layer 120. For example, if the semiconductor layer 120 including silicon-germanium (SiGe) is epitaxially grown directly on the substrate 100 including silicon (Si), crystal defects may occur in the semiconductor layer 120 by the stress caused by the difference between lattice constants of silicon (Si) and silicon-germanium (SiGe). However, according to example embodiments of the inventive concepts, the semiconductor layer 120 may not be in contact with the substrate 100 due to the buffer layer 110, so crystal defects of the semiconductor layer 120 may be reduced. The semiconductor layer 120 may be formed by a SEG process using the substrate 100 or the buffer layer 110 as a seed layer. For example, the SEG process may include a chemical vapor deposition (CVD) process or a molecular beam epitaxy (MBE) process.

The semiconductor layer 120 and the buffer layer 110 may include SiGe. In addition, the buffer layer 110 may further include a semiconductor element of which a lattice constant is greater or smaller than that of SiGe. Because the buffer layer 110 includes the semiconductor element different from the semiconductor layer 120, a compressive force or a tensile force may be provided to a channel region defined in the semiconductor layer 120. The channel region will be described in more detail later.

In other example embodiments, the buffer layer 110 may be omitted. In this case, the semiconductor layer 120 may be formed directly on the substrate 100, and the semiconductor layer 120 may be etched or patterned to form first fins F1.

Figure 2A:
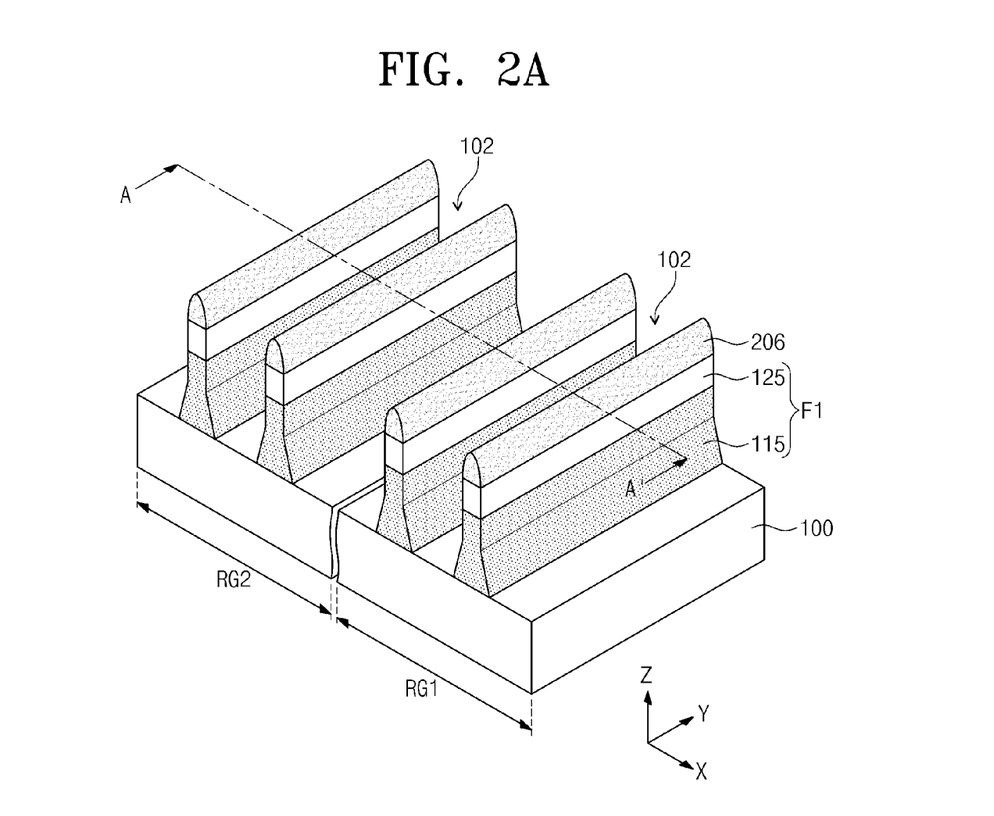
Figure 2B:
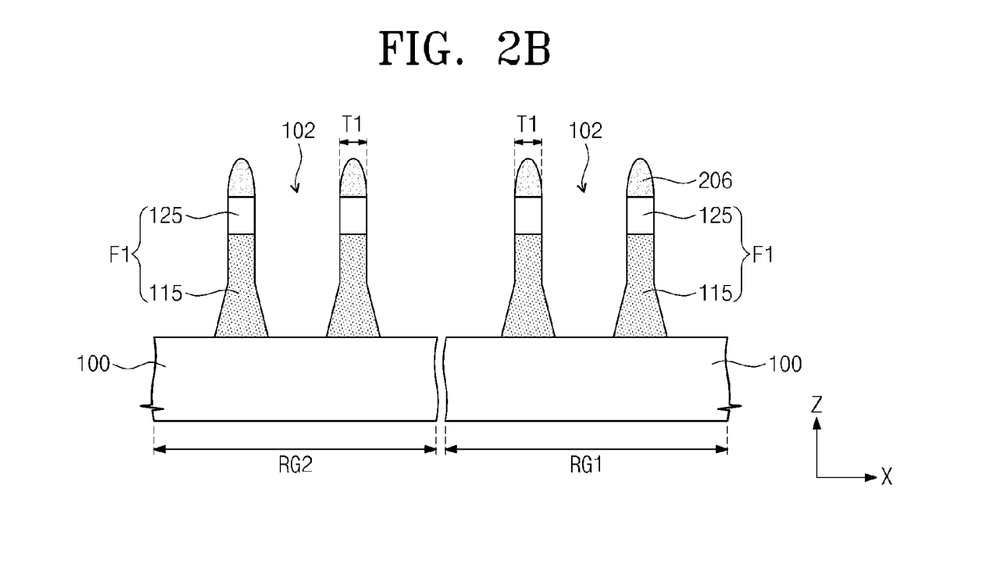

Referring to FIGS. 2A and 2B, first fins F1 protruding from the substrate 100 may be formed on the substrate 100 in the first and second regions RG1 and RG2. In more detail, a first mask layer (not shown) may be formed on the semiconductor layer 120, and the first mask layer may be patterned to form first mask patterns 206 defining the first fins F1. For example, the first mask layer may include at least one of silicon oxide, silicon nitride, silicon oxynitride, photoresist, spin-on-glass (SOG), or spin-on-hardmask (SOH). The first mask layer may be formed by at least one of a physical vapor deposition (PVD) process, a CVD process, an atomic layer deposition (ALD) process, or a spin-coating process.

The semiconductor layer 120 and the buffer layer 110 may be sequentially etched using the first mask patterns 206 as etch masks to form the first fins F1 having a first width T1. Hereinafter, a width of a fin means a width of an upper portion of the fin in the present embodiments. First trenches 102 may be formed between the first fins F1 by the etching process performed on the semiconductor and buffer layers 120 and 110. Upper portions of the first mask patterns 206 may also be etched by the etching process, so the first mask patterns 206 may have rounded surfaces. Even though not shown in the drawings, the substrate 100 under the first trenches 102 may be recessed by over-etching during the etching process.

Each of the first fins F1 may have the first width T1 in a first direction X and a length in a second direction Y. The length in the second direction Y may be greater than the first width T1 in the first direction X, so the first fin F1 may have a line shape extending in the second direction Y. The first direction X may be parallel to the top surface of the substrate 100. The second direction Y may be parallel to the top surface of the substrate 100 and may intersect the first direction X. Each of the first fins F1 may include a buried portion 115 protruding from the top surface of the substrate in a third direction Z and a first protruding portion 125 disposed on the buried portion 115. The third direction Z may be perpendicular to the top surface of the substrate 100 and may also be perpendicular to the first and second directions X and Y. The buried portion 115 may be formed by etching the buffer layer 110, and the first protruding portion 125 may be formed by etching the semiconductor layer 120. The first fins F1 may be doped with dopants for controlling a threshold voltage. In some example embodiments, a doping process for controlling the threshold voltage may be performed on the semiconductor layer 120 before the formation of the first mask layer.

In FIGS. 2A and 2B, a plurality of first fins F1 may be provided on the substrate 100 in each of the first and second regions RG1 and RG2. Alternatively, a single first fin F1 may be provided on the substrate 100 in each of the first and second regions RG1 and RG2. The plurality of first fins F1 in the first region RG1 may form individual transistors, respectively. Alternatively, the plurality of first fins F1 in the first region RG1 may form one transistor. Likewise, the plurality of first fins F1 in the second region RG2 may form individual transistors, respectively, or may form one transistor.

Figure 3A:
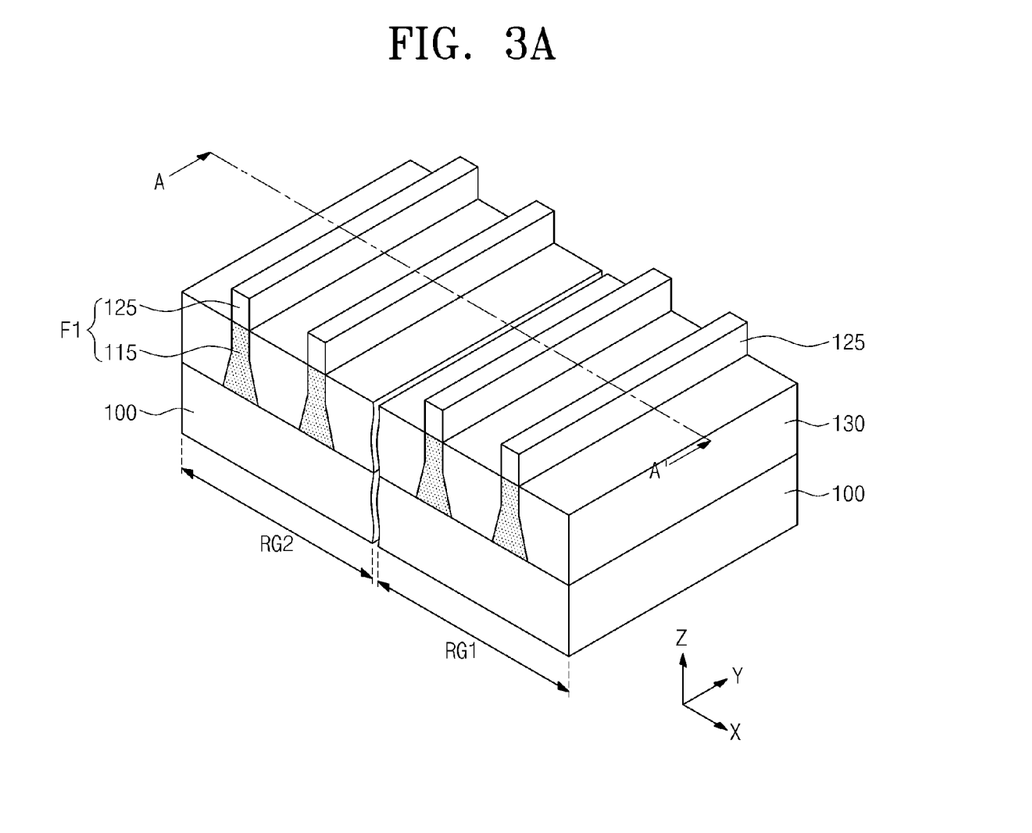
Figure 3B:
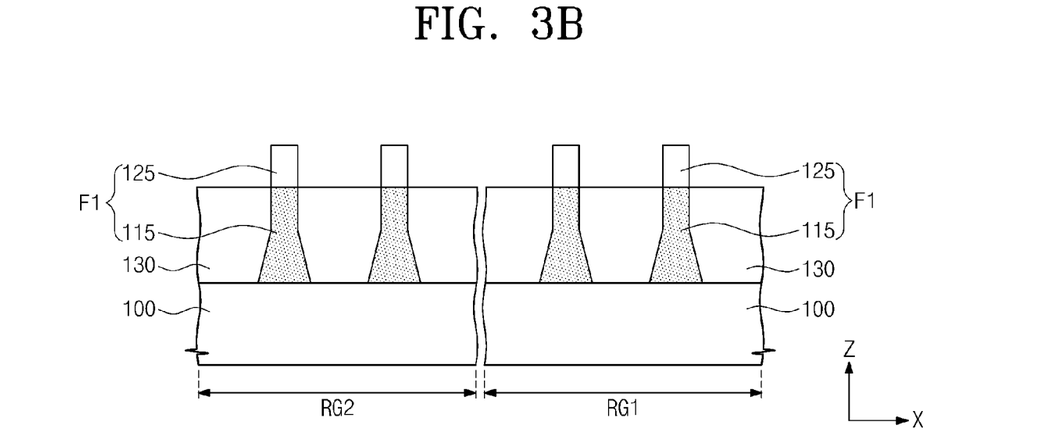

Referring to FIGS. 3A and 3B, a device isolation layer 130 may be formed to cover sidewalls of lower portions of the first fins F1. In some example embodiments, an insulating layer (not shown) may be formed on the substrate 100 in the first and second regions RG1 and RG2, and the insulating layer may be etched until upper portions of the first fins F1 are exposed, thereby forming the device isolation layer 130. In other example embodiments, the first mask patterns 206 may be removed before forming the insulating layer for the device isolation layer 130 or after forming the device isolation layer 130. The exposed portions of the first fins F1 may correspond to the first protruding portions 125. The device isolation layer 130 may include at least one of a high-density plasma (HDP) oxide layer, a SOG layer, or a CVD oxide layer.

Figure 4A:
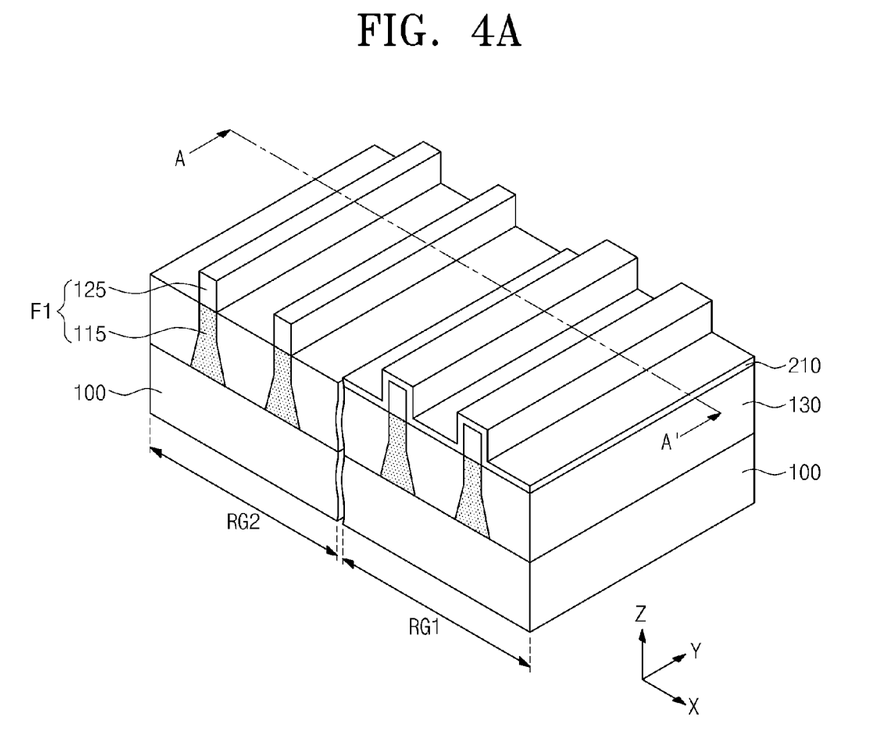
Figure 4B:
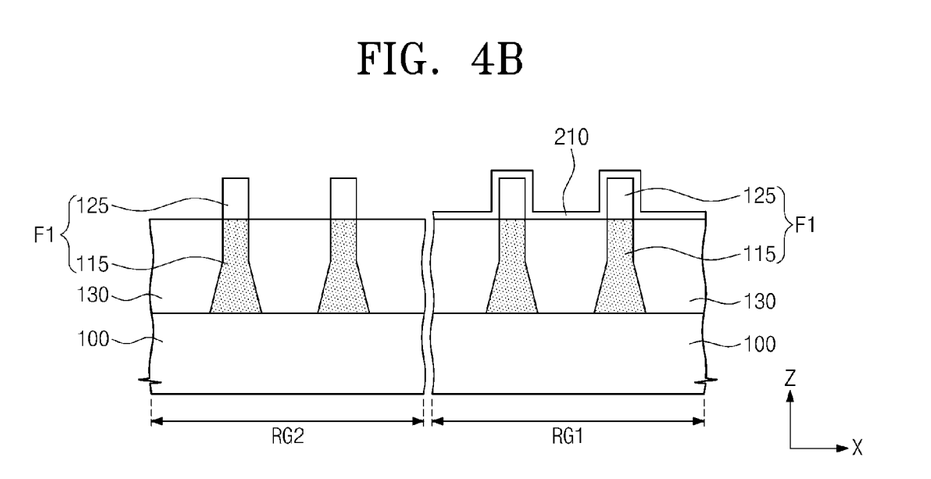

Referring to FIGS. 4A and 4B, a second mask pattern 210 may be formed on the substrate 100 having the device isolation layer 130 thereon. The second mask pattern 210 may cover the first region RG1 and may expose the second region RG2. The second mask pattern 210 may serve as an oxidation prevention layer that prevents the first fins F1 in the first region RG1 from being oxidized. In some example embodiments, the second mask pattern 210 may be formed of a material having an etch selectivity with respect to the device isolation layer 130. For example, the second mask pattern 210 may include at least one of a silicon oxide layer, a silicon nitride layer, a silicon oxynitride layer, a photoresist layer, a SOG layer, or a SOH layer. Here, the second mask pattern 210 may include a different material from the device isolation layer 130.

Figure 5A:
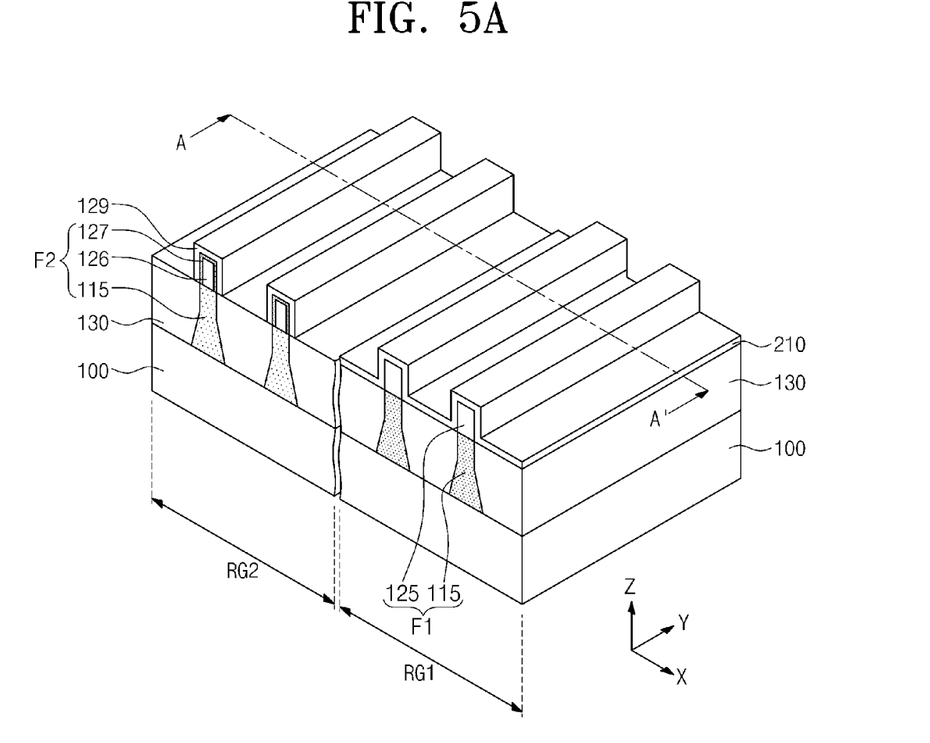
Figure 5B:
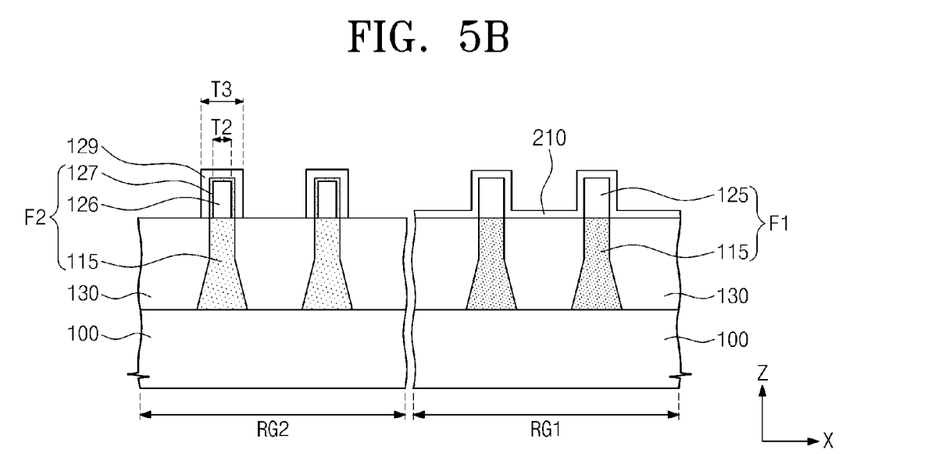

Referring to FIGS. 5A and 5B, the first fins F1 in the second region RG2 may be oxidized to form second fins F2 having a second width T2. In more detail, the first fins F1 in the second region RG2 exposed by the second mask pattern 210 may be selectively oxidized by the oxidation process, but the first fins F1 in the first region RG1 covered with the second mask pattern 210 may not be oxidized.

The first fins F1 in the second region RG2 may be oxidized, so the width of the first fins F1 may be reduced. In more detail, the first protruding portions 125 exposed by the second mask pattern 210 and the device isolation layer 130 may be oxidized to form the second protruding portions 126. The second width T2 of the second protruding portions 126 may be smaller than the first width T1 of the first fins F1. Oxide layers 129, which cover surfaces of the second protruding portions 126, respectively, may be formed simultaneously with the formation of the second protruding portions 126. In addition, germanium (Ge)-rich layers 127 may be formed at interfaces between the second protruding portions 126 and the oxide layers 129, respectively, when the oxide layers 129 are formed. In other words, the second protruding portions 126, the oxide layers 129, and the Ge-rich layers 127 may be formed at the same time by the oxidation process. Each of the second fins F2 may include the buried portion 115, the second protruding portion 126 disposed on the buried portion 115 and the germanium (Ge)-rich layer 127 covering the second protruding portion 126.

Silicon (Si) may be more easily oxidized than germanium (Ge). Thus, if the first fins F1 including SiGe are oxidized, the oxide layers 129 may be rich with silicon oxide (SiO$_2$). The surfaces of the first fins F1 in the second region RG2 may be oxidized, so the widths of the first fins F1 may be reduced to form the second fins F2 and the oxide layers 129 may be formed on the surfaces of the second fins F2. At the same time, germanium (Ge) (not oxidized) may be concentrated under the oxide layers 129 to form the interfaces relatively rich in germanium (Ge) (i.e., the Ge-rich layers 127). The terminology "Ge-rich layer" as used in this disclosure refers to a layer having germanium where a germanium (Ge) concentration of the Ge-rich layer is higher than a Ge concentration of the second protruding portions 126. As such, the Ge-rich layers 127 have a Ge concentration higher than the Ge concentration of the second protruding portions 126. Because the oxide layers 129 are formed on only the surfaces of the second protruding portions 126, a Ge concentration of the insides of the second protruding portions 126 may be substantially equal to a Ge concentration of the first protruding portion 125 in the first region RG1.

A structure including the second protruding portion 126 and the oxide layer 129 disposed thereon may have a third width T3, and the third width T3 may be greater than the first width T1.

The oxidation process may be, but not limited to, a general oxidation process (e.g., a thermal oxidation process, or a plasma oxidation process).

For example, the oxidation process may be performed using an oxygen gas at a temperature of about 200° C. to about 1500° C.

Because a fin field effect transistor uses a fin protruding from a substrate as a body, a short channel effect of the fin field effect transistor may be reduced than that of a planar transistor. However, because the body of the fin field effect transistor is narrower than that of the planar transistor, it may be difficult that a threshold voltage of the fin field effect transistor is controlled by an ion implantation process. According to example embodiments of the inventive concepts, an energy band gap, a strain, and/or a surface charge concentration of the fin including SiGe may be varied depending on a Ge concentration of the surface of the fin. Thus, the threshold voltage of the fin field effect transistor may be varied on depending on the Ge concentration of the surface of the fin. According to some example embodiments of the inventive concepts, the Ge concentration of the surface of the first fin F1 in the first region RG1 may be different from that of the surface of the second fin F2 including the Ge-rich layer 127 in the second region RG2, so the fin field effect transistors having different threshold voltages from each other may be formed in the first region RG1 and the second region RG2, respectively. In other words, according to example embodiments of the inventive concepts, the fins of which surface Ge concentration are different from each other may be easily formed in the first region RG1 and the second region RG2, respectively. Thus, the transistors having the different threshold voltages may be respectively formed in the first and second regions RG1 and RG2 at the same time. In addition, because the Ge concentrations of only the surfaces of the fins are changed, defects of the fins may be reduced.

Figure 6A:
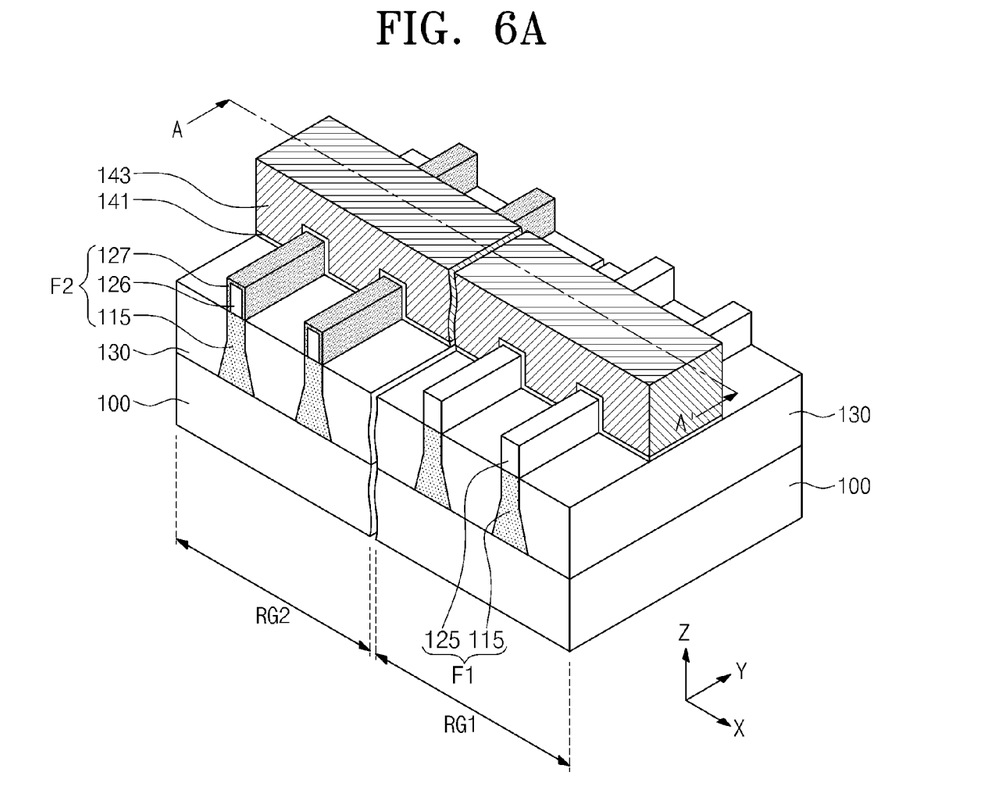
Figure 6B:
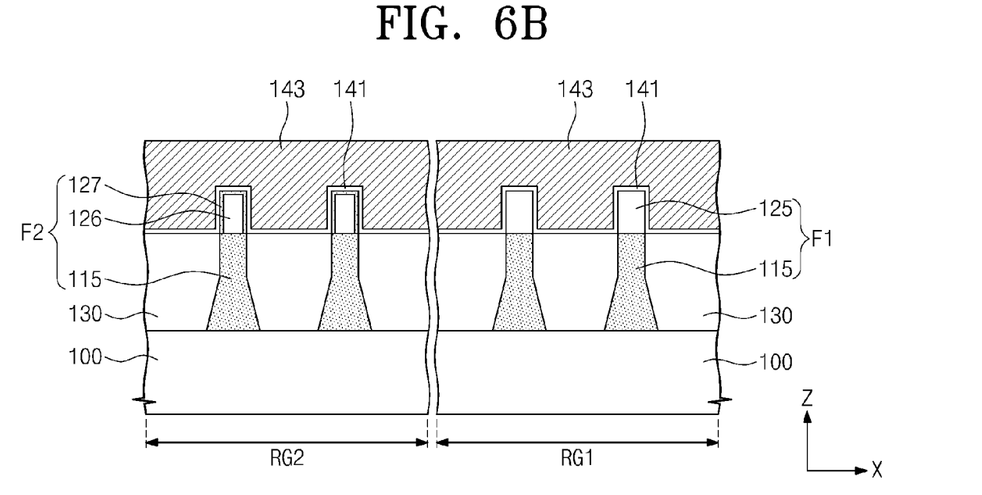

Referring to FIGS. 6A and 6B, the oxide layers 129 in the second region RG2 and the second mask pattern 210 in the first region RG1 may be removed. The oxide layers 129 and the second mask pattern 210 may be removed by a single etching process or a plurality of selective etching process.

Next, a gate dielectric layer (not shown) may be formed on the substrate 100 in the first and second regions RG1 and RG2, and a gate electrode layer (not shown) may be then formed to cover the gate dielectric layer. The gate dielectric layer may include at least one of a silicon oxide layer, a silicon oxynitride layer, or a high-k dielectric layer. For example, the high-k dielectric layer may include at least one of a hafnium oxide layer, a hafnium-silicon oxide, a lanthanum oxide layer, a zirconium oxide layer, a zirconium-silicon oxide layer, a tantalum oxide layer, a titanium oxide layer, a barium-strontium-titanium oxide layer, a barium-titanium oxide layer, a strontium-titanium oxide layer, a lithium oxide layer, an aluminum oxide layer, a lead-scandium-tantalum oxide layer, or a lead-zinc niobate layer. The gate electrode layer may include at least one of a doped semiconductor material, a metal, a conductive metal nitride, or a metal-semiconductor compound (e.g., a metal silicide).

In some example embodiments, each of the gate dielectric layer and the gate electrode layer may be formed by at least one of a CVD process, a sputtering process, or an ALD process.

The gate electrode layer and the gate dielectric layer may be etched using an etch mask to form a gate dielectric pattern 141 and a gate electrode pattern 143. In some embodiments, the gate electrode pattern 143 may be formed using a replacement gate process. For example, the replacement gate process may include forming a sacrificial gate structure including a sacrificial gate dielectric layer and a sacrificial gate electrode, removing the sacrificial gate structure, and replacing the removed sacrificial gate structure with a gate structure including a gate dielectric pattern and a gate electrode pattern. The gate electrode pattern 143 may have a line shape that extends in the first direction X to cross over the first and second fins F1 and F2. The gate dielectric pattern 141 may extend along a bottom surface of the gate electrode pattern 143, so the gate dielectric pattern 141 may cover a top surface and sidewalls of the first protruding portion 125 and a top surface and sidewalls of the second protruding portion 126 having the Ge-rich layer 127 thereon. The gate dielectric pattern 141 may be in contact with the Ge-rich layers 127. In addition, the gate dielectric pattern 141 may horizontally extend from the first and second fins F1 and F2 to partially cover a top surface of the device isolation layer 130.

Generally, a gate dielectric pattern and a gate electrode pattern may have complex multi-layered structures to control threshold voltages of a fin field effect transistor. However, according to example embodiments of the inventive concepts, because the threshold voltages of the fin field effect transistors are controlled using the Ge-rich layers 127 selectively formed, structures of the gate dielectric pattern 141 and the gate electrode pattern 143 may be simplified. In some example embodiments, each of the gate dielectric pattern 141 and the gate electrode pattern 143 may be formed of a single layer. In some example embodiments, the gate electrode pattern 143 may include a same work function layer in the first and second regions RG1 and RG2.

In some example embodiments, the source/drain regions may be formed on the first and second fins F1 and F2 at both sides of the gate electrode pattern 143. In some example embodiments, upper portions of the first and second fins F1 and F2 at both sides of the gate electrode pattern 143 may be etched, and a SEG process may be performed on the etched first and second fins F1 and F2 to form the source/drain regions. Portions of the first and second fins F1 and F2, which are surrounded by the source/drain regions and the gate electrode pattern 143, may be defined as the channel regions.

Like the buried portion 115 (e.g., buffer layer 110 of FIGS. 1A and 1B), the source/drain regions may include a different semiconductor element from the first and second protruding portions 125 and 126) (e.g., the semiconductor layer 120 of FIGS. 1A and 1B). Thus, the source/drain regions may provide a compressive force or a tensile force to the channel regions. If the fin field effect transistors including the first and second fins F1 and F2 are PMOS field effect transistors, the compressive force may be provided to the channel regions. Alternatively, if the fin field effect transistors including the first and second fins F1 and F2 are NMOS field effect transistors, the tensile force may be provided to the channel regions. A conductivity type of the source/drain regions may be different from that of the first and second fins F1 and F2.

The semiconductor device according to some example embodiments of the inventive concepts will be described with reference to FIGS. 6A and 6B.

Referring again to FIGS. 6A and 6B, the substrate 100 including the first and second regions RG1 and RG2 may be provided. The substrate 100 may include a semiconductor-based structure. For example, the substrate 100 may be a silicon substrate or a silicon-on-insulator (SOI) substrate. The first region RG1 and the second region RG2 may correspond to different regions from each other of the substrate 100. For example, the first and second regions RG1 and RG2 may be regions in which different threshold voltages from each other are required. In some example embodiments, all of the first and second regions RG1 and RG2 may be NMOS transistor regions, or PMOS transistor regions. In other example embodiments, one of the first and second regions RG1 and RG2 may be the NMOS transistor region, and the other of the first and second regions RG1 and RG2 may be the PMOS transistor region. However, example embodiments of the inventive concepts are not limited thereto.

The second fins F2 protruding in the third direction Z may be disposed on the substrate 100 of the second region RG2, and the first fins F1 protruding in the third direction Z may be disposed on the substrate of the first region RG1. The third direction Z may be perpendicular to the top surface of the substrate 100. The first and second fins F1 and F2 may have widths in the first direction X and lengths in the second direction Y. Here, the lengths may be greater than the widths. In other words, the first and second fins F1 and F2 may have line shapes extending in the second direction Y. The first direction X may be parallel to the top surface of the substrate 100. The second direction Y may be parallel to the top surface of the substrate 100 and may intersect the first direction X.

Each of the first fins F1 may include a buried portion 115 protruding from the top surface of the substrate 100 in the third direction Z and a first protruding portion 125 disposed on the buried portion 115. Each of the second fins F2 may include a buried portion 115 protruding from the top surface of the substrate 100 in the third direction Z, a second protruding portion 126 disposed on the buried portion 115, and a Ge-rich layer 127 disposed on the surface of the second protruding portion 126.

The first and second protruding portions 125 and 126 may include silicon-germanium (SiGe). If the substrate 100 includes silicon (Si), each of the buried portions 115 may include a buffer layer (110 of FIGS. 1A and 1B) capable of relaxing (or, alternatively, reducing) the difference between the lattice constant of the substrate 100 and the lattice constant of the first and second protruding portions 125 and 126. The buffer layers may further include a semiconductor element of which a lattice constant is greater or smaller than that of SiGe. Because the buffer layers may include the different semiconductor element from the first and second protruding portions 125 and 126, the compressive force or the tensile force may be provided to the channel regions defined in the first and second protruding portions 125 and 126. In other example embodiments, the buffer layers may be omitted. In this case, the buried portion 115 and the first protruding portion 125 which are stacked in the first region RG1 may constitute the first fin F1 of one united body, and the buried portion 115 and the second protruding portion 126 which are stacked in the second region RG2 may constitute the second fin F2 of one united body.

The first protruding portions 125 may have a first width T1 (see FIG. 2B), and the second protruding portions 126 may have a second width T2 (see FIG. 5B). Here, the second width T2 may be smaller than the first width T1.

The device isolation layer 130 may be disposed on the substrate 100 to cover the sidewalls of the buried portions 115 of the first and second fins F1 and F2. In other words, the buried portions 115 may be surrounded by the substrate 100, the device isolation layer 130, and the first and second protruding portions 125 and 126. The first and second protruding portions 125 and 126 may protrude upwardly from the device isolation layer 130. For example, top surfaces of the first and second protruding portions 125 and 126 may be higher than a top surface of the device isolation layer 130. The device isolation layer 130 may include at least one of a high-density plasma (HDP) oxide layer, a SOG layer, or a CVD oxide layer.

The Ge-rich layers 127 may be disposed on the surfaces of the second protruding portions 126, respectively. For example, the Ge-rich layers 127 may cover the surfaces of the second protruding portions 126, respectively. The Ge-rich layers 127 may be in contact with the gate dielectric pattern 141. For example, the Ge-rich layers 127 may be disposed between the gate dielectric pattern 141 and the second protruding portions 126. The Ge concentration of the Ge-rich layers 127 may be greater than the Ge concentration of the second protruding portions 126. Meanwhile, the Ge concentration of the insides of the second protruding portions 126 may be substantially equal to the Ge concentration of the first protruding portions 125. The surfaces of the first protruding portions 125 may not be covered with the Ge-rich layers 127.

The gate dielectric pattern 141 and the gate electrode pattern 143 may be sequentially stacked on the first and second fins F1 and F2. The gate electrode pattern 143 may have a line shape which extends in the first direction X to cross over the first and second fins F1 and F2. The gate dielectric pattern 141 may extend along the bottom surface of the gate electrode pattern 143, so the gate dielectric pattern 141 may cover the top surfaces and sidewalls of the first and second protruding portions 125 and 126. In addition, the gate dielectric pattern 141 may horizontally extend from the first and second fins F1 and F2 to partially cover the top surface of the device isolation layer 130.

The gate dielectric pattern 141 may include at least one of a silicon oxide layer, a silicon oxynitride layer, or a high-k dielectric layer. For example, the high-k dielectric layer may include at least one of a hafnium oxide layer, a hafnium-silicon oxide, a lanthanum oxide layer, a zirconium oxide layer, a zirconium-silicon oxide layer, a tantalum oxide layer, a titanium oxide layer, a barium-strontium-titanium oxide layer, a barium-titanium oxide layer, a strontium-titanium oxide layer, a lithium oxide layer, an aluminum oxide layer, a lead-scandium-tantalum oxide layer, or a lead-zinc niobate layer. The gate electrode pattern 143 may include at least one of a doped semiconductor material, a metal, a conductive metal nitride, or a metal-semiconductor compound.

Even though not shown in the drawings, source/drain regions (not shown) may be disposed on the first and second fins F1 and F2 at both sides of the gate electrode pattern 143. Portions of the first and second fins F1 and F2, which are surrounded by the source/drain regions and the gate electrode pattern 143, may be defined as the channel regions. The source/drain regions may include a different semiconductor element from the semiconductor layer 120 (see FIGS. 1A and 1B), like the buffer layer 110 (see FIGS. 1A and 1B). Thus, the source/drain regions may provide a compressive force or a tensile force to the channel regions. If the fin field effect transistors including the first and second fins F1 and F2 are PMOS field effect transistors, the compressive force may be provided to the channel regions. Alternatively, if the fin field effect transistors including the first and second fins F1 and F2 are NMOS field effect transistors, the tensile force may be provided to the channel regions. A conductivity type of the source/drain regions may be different from that of the first and second fins F1 and F2.

According to example embodiments of the inventive concepts, the second fins F2 of the second region RG2 may include the Ge-rich layers 127 disposed on the second protruding portions 126, unlike the first fins F1 of the first region RG1. For example, the surface Ge concentration of the first fins F1 including SiGe in the first region RG1 may be different from that of the second fins F2 including SiGe in the second region RG2, so the energy band gap, the strain, and/or the surface charge concentration of the first fins F1 may be different from those of the second fins F2.

In other words, a threshold voltage of a first transistor using the first fin F1 as a channel region may be different from a threshold voltage of a second transistor using the second fin F2 as a channel region.

Figure 7A:
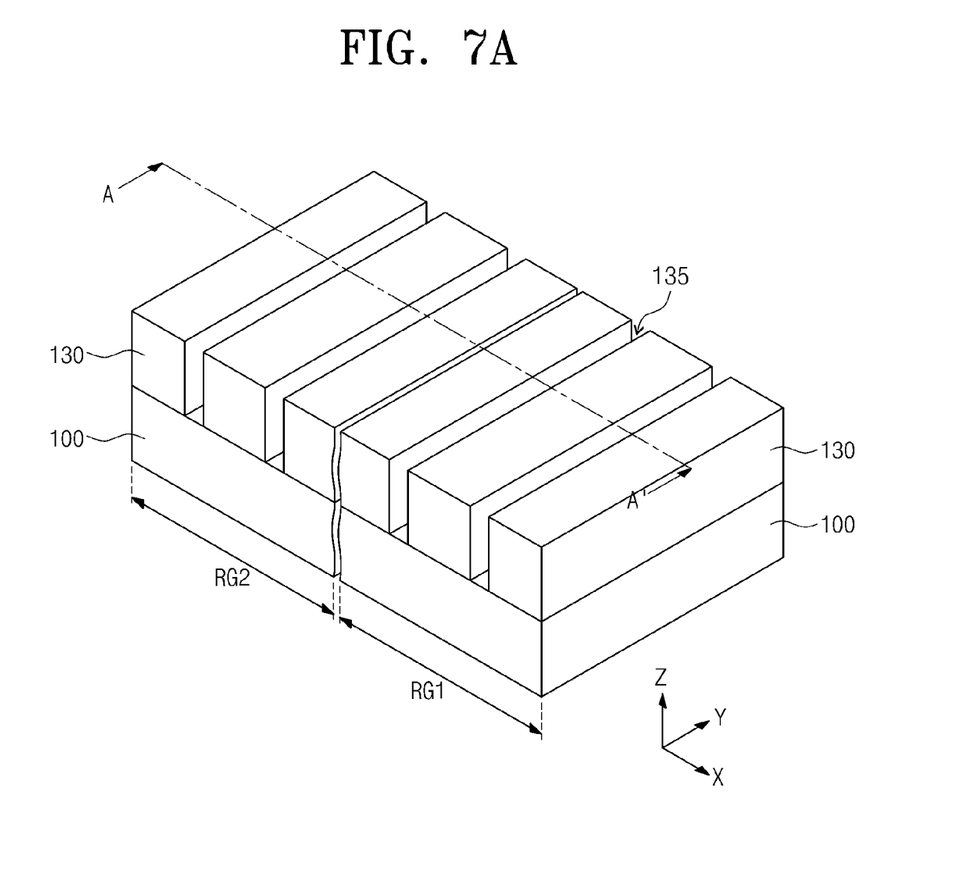
FIGS. 7A and 8A are perspective views illustrating a method for manufacturing a semiconductor device according to other example embodiments of the inventive concepts.
Figure 7B:
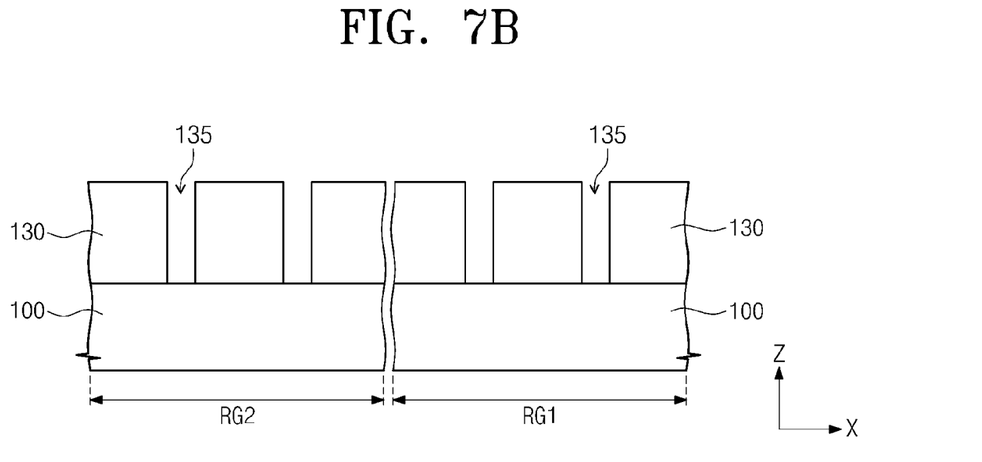
FIGS. 7B and 8B are cross-sectional views taken along lines A-A' of FIGS. 7A and 8A, respectively.
Figure 8A:
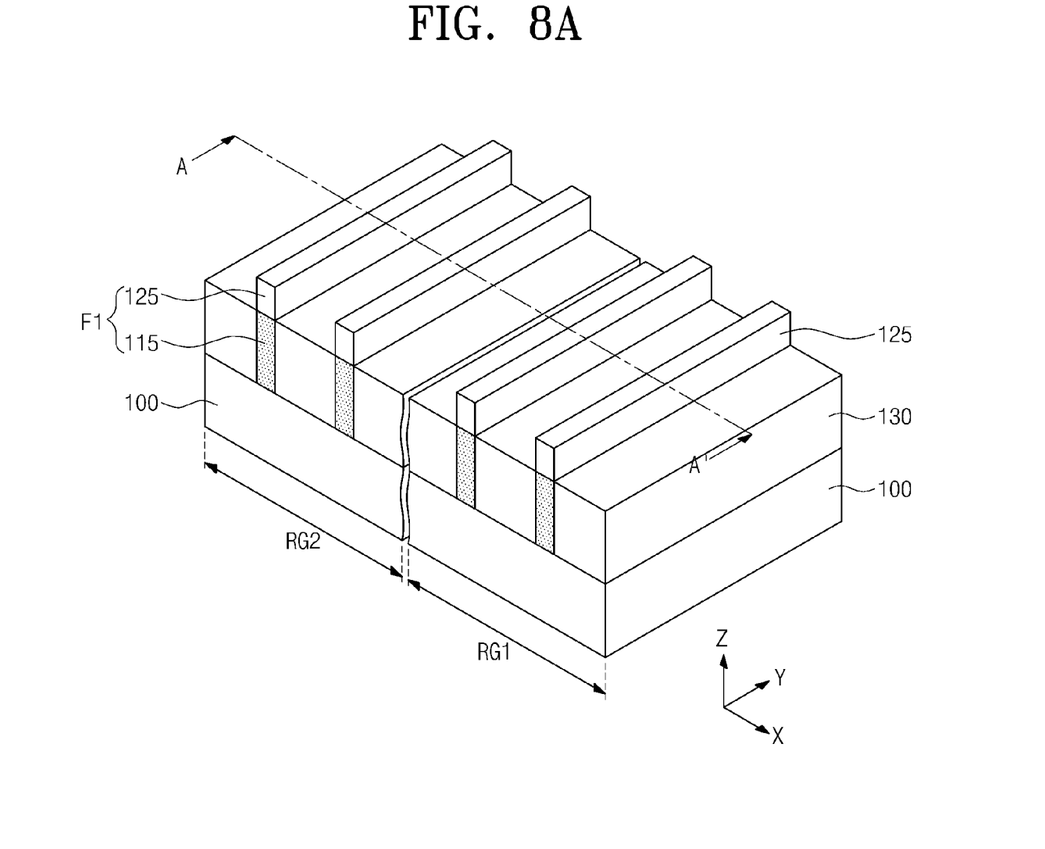
Figure 8B:
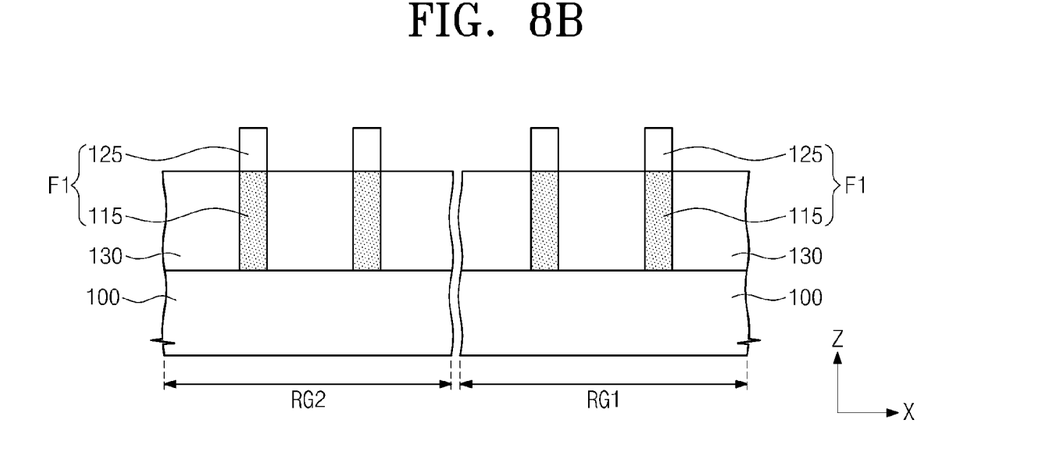

A method for manufacturing a semiconductor device according to other example embodiments will be described with reference to FIGS. 7A, 7B, 8A, and 8B. FIGS. 7A and 8A are perspective views illustrating a method for manufacturing a semiconductor device according to other example embodiments of the inventive concepts. FIGS. 7B and 8B are cross-sectional views taken along lines A-A' of FIGS. 7A and 8A, respectively.

In the present example embodiments, the same elements as described in the embodiment of FIGS. 1A to 6A and 1B to 6B will be indicated by the same reference numerals or the same reference designators. Hereinafter, the descriptions to the same element as in the embodiment of FIGS. 1A to 6A and 1B to 6B will be omitted or mentioned briefly for the purpose of ease and convenience in explanation.

Referring to FIGS. 7A and 7B, a device isolation layer 130 may be formed on a substrate 100. The device isolation layer 130 may be patterned to form second trenches 135. The second trenches 135 may expose the top surface of the substrate 100. The second trenches 135 may extend in the second direction Y parallel to the top surface of the substrate 100 and may be spaced apart from each other in the first direction X intersecting the second direction Y. In other words, the device isolation layer 130 may be patterned to define regions in which first fins F1 will be formed.

Referring to FIGS. 8A and 8B, first fins F1 may be formed to fill the second trenches 135, respectively. In more detail, buried portions 115 may be first formed to fill the second trenches 135, respectively. Each of the buried portions 115 may include the buffer layer 110 (see FIGS. 1A and 1B). The buried portions 115 may be formed by a selective epitaxial growth (SEG) process using the substrate 100 exposed by the second trenches 135 as a seed layer. Subsequently, first protruding portions 125 which protrude in the third direction Z may be formed on the buried portions 115, respectively. The third direction Z may be perpendicular to the top surface of the substrate 100 and may also be perpendicular to the first and second directions X and Y. The first protruding portions 125 may be formed by a SEG process using the buried portions 115 as a seed layer. Each of the first protruding portions 125 may include the semiconductor layer 120 (see FIGS. 1A and 1B).

The buried portions 115 and the first protruding portions 125 may constitute first fins F1. In other example embodiments, the buffer layers may be omitted. In this case, the buried portion 115 and the first protruding portion 125 which are sequentially stacked may constitute the first fin F1 of one united body.

The same subsequent processes as described with reference to FIGS. 4A to 6A and 4B to 6B may be performed to manufacture a semiconductor device.

Figure 9:
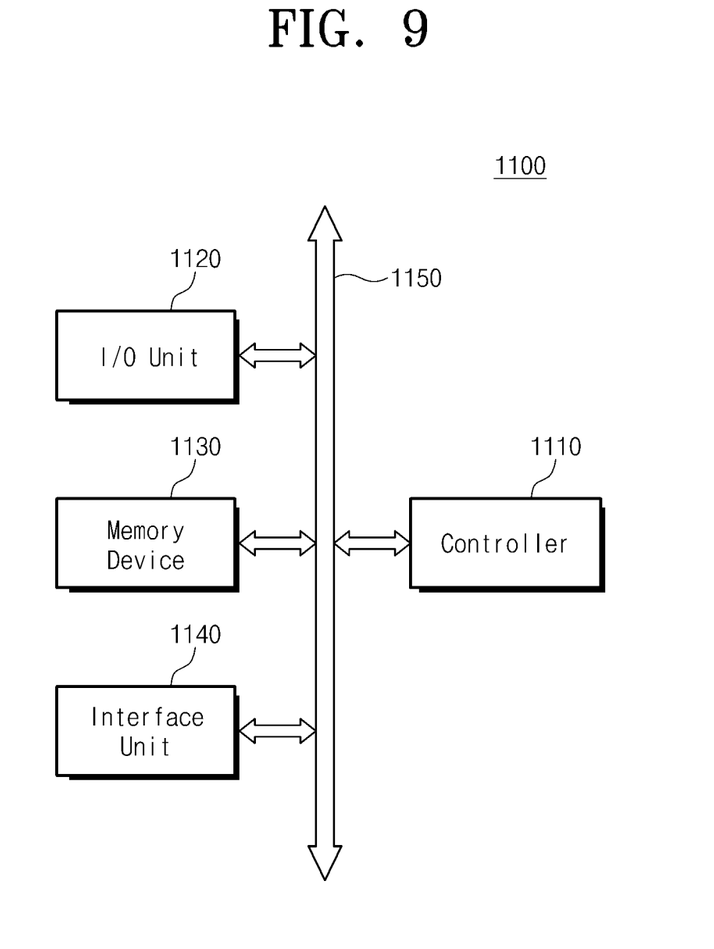
FIG. 9 is a schematic block diagram illustrating an electronic system including a semiconductor device according to example embodiments of the inventive concepts.

FIG. 9 is a schematic block diagram illustrating an electronic system including a semiconductor device according to example embodiments of the inventive concepts.

Referring to FIG. 9, an electronic system 1100 according to example embodiments of the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna a wireless/cable transceiver. Although not shown in the drawings, the electronic system 1100 may further include a fast dynamic random access memory (DRAM) device and/or a fast static random access memory (SRAM) device which acts as a cache memory for improving an operation of the controller 1110. At least one of the semiconductor devices according to the aforementioned example embodiments of the inventive concepts may be provided into at least one of the memory device 1130, the controller 1110, or the I/O unit 1120.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

According to example embodiments of the inventive concepts, the field effect transistors may have the different threshold voltages from each other by means of the different surface Ge concentrations of the SiGe fins. In addition, the SiGe fins having the different surface Ge concentrations may be easily formed, and the field effect transistors having the different threshold voltages may be formed at the same time.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a semiconductor device, the method comprising:
    forming first fins protruding from a substrate, the substrate including a first region and a second region, and the first fins including silicon-germanium (SiGe);
    forming a first mask pattern to expose the first fins disposed in the second region, the first mask pattern covering the first fins disposed in the first region;
    directly oxidizing the exposed first fins in the second region to form second fins in the second region;
    forming germanium (Ge)-rich layers, each of the germanium (Ge)-rich layers disposed on top and side surfaces of a respective one of the second fins; and
    forming a gate dielectric pattern and a gate electrode pattern that cover the germanium (Ge)-rich layers on the second fins of the second region and cover the first fins of the first region,
    wherein portions of the first and second fins under the gate electrode are defined as channel regions.

2. The method of claim 1, wherein a Ge concentration of the second fins is substantially equal to a Ge concentration of the first fins.

3. The method of claim 1, wherein the oxidizing selectively oxidizes the first fins in the second region using the first mask pattern as an oxidation prevention layer.

4. The method of claim 1, wherein the oxidizing reduces widths of the first fins in the second region.

5. The method of claim 1, further comprising:
    forming a device isolation layer covering sidewalls of the first fins in the first and second regions,
    the first fins including protruding portions protruding from the device isolation layer and including SiGe.

6. The method of claim 1, wherein
    the substrate includes silicon (Si); and
    the forming the first fins includes,
        forming buried portions on the substrate, and
        forming protruding portions including SiGe on the buried portions,
        the buried portions including buffer layers that reduce a difference between a lattice constant of the substrate and a lattice constant of the protruding portions.

7. The method of claim 1, wherein the forming the first fins comprises:
    forming an epitaxial layer including SiGe on the substrate;
    forming second mask patterns on the epitaxial layer; and
    etching the epitaxial layer using the second mask patterns as etch masks.

8. The method of claim 1, wherein the forming the first fins comprises:
    forming a device isolation layer on the substrate;
    forming trenches in the device isolation layer, the trenches exposing a top surface of the substrate; and
    growing epitaxial layers from the top surface of the substrate exposed by the trenches, the epitaxial layers filling the trenches and including SiGe.

9. The method of claim 1, wherein
    the oxidizing oxidizes surfaces of the first fins in the second region to form the second fins and oxide layers covering the second fins, and
    the Ge-rich layers are formed along with the oxide layers at a same time and between the second fins and the oxide layers.

10. The method of claim 9, further comprising:
    removing the oxide layers disposed on the second fins and the first mask pattern disposed in the first region; and
    forming a gate dielectric pattern and a gate electrode pattern that cover the second fins of the second region and the first fins of the first regions.

11. A method for manufacturing a semiconductor device, comprising:
    forming a first fin protruding from a first region of a substrate and including silicon-germanium (SiGe); and
    forming a second fin protruding from a second region of the substrate and including SiGe, the second fin including a germanium (Ge)-rich layer disposed on a surface of the second fin,
    wherein a Ge concentration of the Ge-rich layer is greater than Ge concentrations of the first and second fins,
    wherein the forming the second fin includes:
        forming a mask pattern to expose a fin including SiGe in the second region, the mask pattern covering the first fin in the first region; and
        directly oxidizing the exposed fin in the second region to form the Ge-rich layer and an oxide layer, the oxide layer being on top and side surfaces of the Ge-rich layer, and
    wherein the oxidizing reduces a width of the fin in the second region such that a width of an upper portion of the second fin is smaller than a width of an upper portion of the first fin based on different conductivity types of transistors defined thereby.

12. The method of claim 11, further comprising:
    forming a device isolation layer covering sidewalls of the first and second fins,
    wherein the forming the first fin includes forming a first buried portion surrounded by the device isolation layer, and forming a first protruding portion protruding from the first buried portion,
    wherein forming the second fin includes forming a second buried portion surrounded by the device isolation layer, forming a second protruding portion protruding from second buried portion, and forming the Ge-rich layer covering the second protruding portion.

13. The method of claim 12, wherein
    the substrate includes silicon (Si), and
    the first and second buried portions include buffer layers that reduce a difference between a lattice constant of the substrate and a lattice constant of the first and second protruding portions.

14. The method of claim 11, further comprising:
    a gate dielectric pattern and a gate electrode pattern that cover the first and second fins,
    wherein the Ge-rich layer is in contact with the gate dielectric pattern.

15. A method of manufacturing a semiconductor device, comprising:
    forming a first fin and a second fin extending over a first region and a second region of a substrate, respectively, the first and the second fins including silicon germanium (SiGe);
    forming a first mask pattern over the first fin so as to expose the second fin; and directly oxidizing the exposed second fin to form a third fin including a SiGe layer in an upper portion thereof and a germanium (Ge)-rich layer covering top and side surfaces of the SiGe layer, wherein a width of the SiGe layer of the third fin is smaller than a width of an upper portion of the first fin such that a transistor defined by the third fin has a different threshold voltage than a transistor defined by the first fin.

16. The method of claim 15, wherein the third fin further includes an oxide layer covering surfaces of the SiGe layer, the oxide layer being formed during the oxidizing.

17. The method of claim 15, further comprising:
forming a device isolation pattern having trenches therein over the first and the second regions of the substrate,
wherein the forming the first fin and the second fin includes,
   forming a buried portion of the first fin and a buried portion of the second fin filling the trench over a respective one of the first and second regions,
   the buried portions of the first and second fins including a semiconductor element having a lattice constant different than a lattice constant of SiGe, and
   forming a protruding portion of the first fin and a protruding portion of the second fin such that the protruding portions protrude from a respective one of the buried portions, the protruding portions of the first and second fins including SiGe.

18. The method of claim 15, wherein the forming the first fin and a second fin includes,
   growing a semiconductor layer over the substrate;
   forming a second mask pattern over the semiconductor layer; and
   etching the semiconductor layer using the second mask pattern as an etching mask to form the first and second fins,
   a Ge concentration of the first fin being substantially equal to a Ge concentration of the SiGe layer.

19. The method of claim 15, wherein the oxidizing includes removing Si from the SiGe in the second fin to form the Ge-rich layer so that a Ge concentration of the Ge-rich layer is substantially higher than that of the SiGe layer of the third fin.

* * * * *